US006464794B1

(12) United States Patent
Park et al.

(10) Patent No.: US 6,464,794 B1
(45) Date of Patent: Oct. 15, 2002

(54) PROCESS CHAMBER USED IN MANUFACTURE OF SEMICONDUCTOR DEVICE, CAPABLE OF REDUCING CONTAMINATION BY PARTICULATES

(75) Inventors: Jeong-hyuck Park; Hee-duk Kim; Jung-hun Cho; Jong-wook Choi; Sung-bum Cho; Young-koo Lee; Jin-sung Kim; Jang-eun Lee; Ju-hyuck Chung; Sun-hoo Park, all of Kyungki-do; Jae-hyun Lee, Yongin; Shin-woo Nam, Kyungki-do, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/404,631

(22) Filed: Sep. 23, 1999

(30) Foreign Application Priority Data

Sep. 23, 1998 (KR) .............................. 98-39486
Jun. 16, 1999 (KR) .............................. 99-22541

(51) Int. Cl.$^7$ .......................... C23C 16/00; H05H 1/00
(52) U.S. Cl. .................. 118/728; 118/724; 156/345.51; 156/345.52; 156/345.53; 438/716
(58) Field of Search ................................ 118/728, 715, 118/724, 725, 720; 156/345.51, 345.52, 345.53; 438/716, 715

(56) References Cited

U.S. PATENT DOCUMENTS

| 5,437,757 | A | * | 8/1995 | Rice et al. ................... 156/345 |
| 5,707,485 | A | | 1/1998 | Rolfson et al. .......... 156/643.1 |
| 5,805,408 | A | * | 9/1998 | Maraschin et al. .......... 361/234 |
| 5,830,808 | A | | 11/1998 | Chapmen ..................... 438/729 |
| 5,920,797 | A | * | 7/1999 | Balance et al. ............. 438/758 |
| 5,922,133 | A | * | 7/1999 | Tepman et al. ............. 118/720 |
| 6,117,349 | A | * | 9/2000 | Huang et al. .................. 216/71 |
| 6,200,388 | B1 | * | 3/2001 | Jennings ..................... 118/728 |

FOREIGN PATENT DOCUMENTS

| JP | 7-94480 A | * | 4/1995 | ........... H01L/21/68 |
| JP | 8-335568 A | * | 12/1996 | ....... H01L/21/3065 |

* cited by examiner

Primary Examiner—Marian C. Knode
Assistant Examiner—P. Hassanzadeh
(74) Attorney, Agent, or Firm—Lee & Sterba, P.C.

(57) ABSTRACT

A process chamber used in the manufacture of a semiconductor device for etching a material layer on a semiconductor wafer includes an electrostatic chuck for holding the semiconductor wafer, and an annular edge ring which surrounds the side of the semiconductor wafer on the electrostatic chuck to prevent the semiconductor wafer from departing from its original position. The annular edge ring has a first side which faces the side of the semiconductor wafer and contacts firmly with the side of the semiconductor wafer.

9 Claims, 10 Drawing Sheets

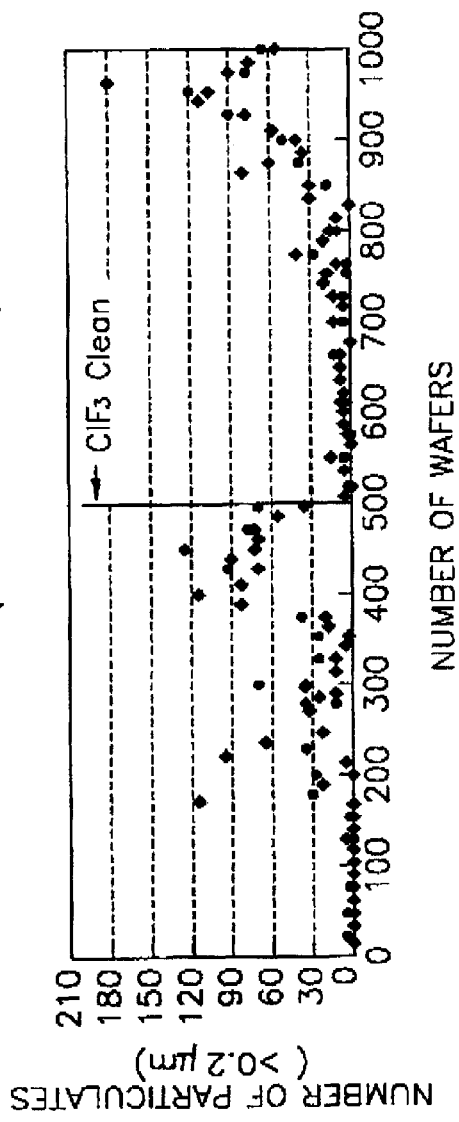
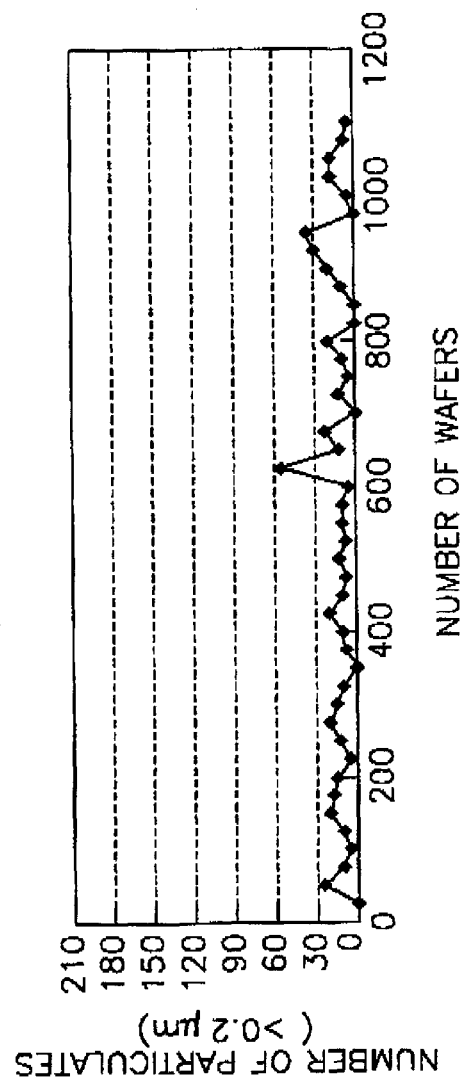
FIG. 21A (PRIOR ART)
FIG. 21B

PROCESS CHAMBER USED IN MANUFACTURE OF SEMICONDUCTOR DEVICE, CAPABLE OF REDUCING CONTAMINATION BY PARTICULATES

BACKGROUND OF THE INVENTION

1. Field of the Invention

The present invention relates to equipment for manufacturing semiconductor devices, and more particularly, to a process chamber used in the manufacture of semiconductor devices, capable of reducing contamination by particulates.

2. Description of the Related Art

In general, integrated circuits (ICs) are manufactured on semiconductor wafers formed of, for example, silicon. During the manufacture of the ICs, a series of steps, for example, photo masking, deposition of material layers, oxidation, nitridation, ion implantation, diffusion and etching, are conducted to obtain a final product. Most of these steps are carried out in a process chamber. Thus, reducing contamination by particulate in the process chamber has been recognized as a critical factor for determining the quality of a semiconductor device. Particulates are generated in a process chamber depending on the structure of the process chamber, the material used to form the chamber, and the types of reaction gases used in the chamber. In general, the process chamber is contaminated by particulates due to the following two reasons.

The first reason, which usually occurs in a process chamber used for etching, is the difference in temperature between edge rings (or focus rings) near a semiconductor wafer and the parts from which the process chamber is constructed. The second reason, which usually occurs in a process chamber used for a deposition process, is the unsmooth flow of a reaction gas near guide rings for guiding the edge of a semiconductor wafer.

FIG. 1 is a view illustrating the generation of particulates in a process chamber during an etching process. In detail, FIG. 1 is a sectional view illustrating an electrostatic chuck supporting a semiconductor wafer in a conventional process chamber for an etching process using plasma. FIG. 2 is an enlarged view of the edge (portion A) of the semiconductor wafer shown in FIG. 1, and FIG. 3 is a plan view of FIG. 1.

Referring to FIG. 1, an electrostatic chuck 20 holds a semiconductor wafer 10 using electrostatic adsorption. Although not shown in FIG. 1, a power supply for supplying a high voltage is connected to the electrostatic chuck 20 to induce static electricity. Lift pins 21 for moving the semiconductor wafer 10 up and down when loading or unloading the semiconductor wafer 10, pass through the center of the electrostatic chuck 20. The lift pins 21 are in contact with a support plate 22 installed below the electrostatic chuck 20. The support plate 22 moves upwards in response to force applied by an external lifter (not shown), in a direction indicated by an arrow 23. The lift pins 21 move upwards in response to upward movement of the support plate 22. Then, the lift pins 21 protrude past the surface of the electrostatic chuck 20, and the semiconductor wafer 10 supported by the lift pins 21 is separated from the surface of the electrostatic chuck 20.

Edge rings 24 are installed at the upper edges of the electrostatic chuck 20 to fix the semiconductor wafer 10. As shown in FIGS. 2 and 3, the edge ring 24 is separated from the edge of the semiconductor wafer 10 by a small gap 25. Also, there is a space 26 between part of the surface of the edge ring 24 and the periphery of the bottom surface of the semiconductor wafer 10. Also, a coupling ring 27 made of aluminum (Al) is interposed between the edge ring 24 and the electrostatic chuck 20. The semiconductor wafer 10 is surrounded by a focus ring 28. The focus ring 28 draws a plasma forming region to the edge of the semiconductor wafer 10 during the etching process, such that the plasma forming region is uniformly formed across the semiconductor wafer 10.

However, in such a conventional process chamber, plasma enters into the small gap 25 between the edge ring 24 and the edge of the semiconductor wafer 10, and thus the bottom surface of the semiconductor wafer may be etched. Polymers, which are byproducts generated by the etching, adhere to the bottom surface of the semiconductor wafer 10 and bind the edge ring 24 to the electrostatic chuck 20. When the edge ring 24 is separated from the electrostatic chuck 20 for repair and maintenance after the process is completed, the edge ring 24 can be broken due to it being bound to the electrostatic chuck 20 by the polymer.

When the etching is repeated several times, the edge ring 24 is etched along its inner circumference, so that the gap between the edge ring 24 and the semiconductor wafer 10 becomes wider. As a result, the edge ring 24 strikes against the edge of a platen zone of the semiconductor wafer (portion B of FIG. 3), so that a part of the semiconductor wafer 10 can be broken.

FIG. 4 is another view illustrating the generation of particulates in a process chamber used for an etching process. In detail, FIG. 4 is a sectional view of an electrostatic chuck 20 in which a focus ring 40 is included but not the edge ring shown in FIG. 3.

Referring to FIG. 4, a semiconductor wafer 10 is held by an electrostatic force produced by an electrostatic chuck 20, through which lift pins 21 are inserted. An annular focus ring 40 is arranged around the edge of the electrostatic chuck 20. The focus ring 40 draws a plasma forming region to the edge of the semiconductor wafer 10 during the etching process, such that the plasma forming region is uniformly formed across the semiconductor wafer 10. Further, the focus ring 40 acts as an edge ring, thereby preventing the semiconductor wafer 10 from deviating from its original position.

The upper part of the focus ring 40 is rounded, and the height of the focus ring is higher than the surface of the semiconductor wafer 10. Most of the polymers generated in the process chamber accumulate on the protruding top of the focus ring 40. Here, the amount and type of accumulated polymer varies according to the material forming the metal layer to be etched, and the distribution in temperature in the reaction chamber. For example, if a metal layer to be etched is formed of tungsten (W), an etching gas used for etching the metal layer, for example, $SF_6$, reacts with the Al component of the process chamber and increases the concentration of Al in the process chamber, thereby generating floating particulates of $Al_xF_y$. Also, if a metal layer to be etched is formed of Al, an etching gas used for etching the metal layer, for example, $Cl_2$ or $BCl_3$, generates polymers of $Al_xCl_y$. Such polymers lie on the protruding portion of the focus ring 40, which is the farthest away from a heat source (not shown), and may fall onto the semiconductor wafer 10 due to a change in internal pressure, thereby causing the process to fail.

FIG. 5 is a sectional view illustrating the generation of particulates in a process chamber used for a deposition process. FIG. 5 shows a wafer support portion of a process chamber for chemical vapor deposition (CVD). FIG. 6 is an enlarged view of the portion C of FIG. 5.

Referring to FIGS. 5 and 6, a semiconductor wafer 10 is seated on a wafer chuck 50, and a heater 51 is placed below the wafer chuck 50. The semiconductor wafer 10 is guided by an annular guide ring 52 placed around the edge of the wafer chuck 50. However, because a space d between the guide ring 52 and the wafer chuck 50 is very narrow, a reaction gas is stagnant in the space d and does not flow smoothly therein. As a result, the reaction gases staying in the space d react with each other abnormally, which results in the growth of an undesirable material layer 53. The material layer 53 may undesirably contaminate the wafer 10.

As described above, a process chamber used for etching or deposition produces particulates for various reasons, increasing the likelihood of failure of the semiconductor devices on wafer 10. Thus, it would be desirable to prevent such a failure by eliminating factors which may cause the generation of particulates in the process chamber during the manufacturing of the devices.

SUMMARY OF THE INVENTION

Consistent with the present invention, a process chamber for use in the manufacture of a semiconductor device, changes the structure or material of the process chamber to suppress generation of particulates.

In one aspect, a process chamber used in the manufacture of semiconductor device for etching a material on a semiconductor wafer using plasma includes an electrostatic chuck for holding the semiconductor wafer, and an annular edge ring which surrounds a side of the semiconductor wafer on the electrostatic chuck to prevent the semiconductor wafer from departing from its original position. The distance between the side of the semiconductor wafer and the first side is preferably less than 0.15 mm.

In another aspect, a process chamber used in the manufacture of a semiconductor device for etching a material on a semiconductor wafer using plasma includes an electrostatic chuck for holding the semiconductor wafer, and an annular focus ring which surrounds the side of the semiconductor wafer on the electrostatic chuck to prevent the semiconductor wafer from departing from its original position and to make the plasma distribution uniform by drawing the plasma. The annular focus ring has a first side which faces the side of the semiconductor wafer and contacts the side of the semiconductor wafer.

In another aspect, a process chamber used in the manufacture of a semiconductor device for etching a material on a semiconductor wafer using plasma includes an electrostatic chuck for holding the semiconductor wafer, a gas supply conduit, installed facing the upper surface of the semiconductor wafer, for supplying reaction gases to the upper space of the semiconductor wafer, wherein the gas supply conduit formed is slanted at a first angle with respect to the vertical direction, such that relatively more reaction gases are provided to a center of the semiconductor wafer than to a periphery of the semiconductor wafer, and a radio frequency power source for forming plasma in the upper space of the semiconductor wafer by ionizing the supplied reaction gases.

In another aspect, a process chamber used in the manufacture of a semiconductor device for etching a material layer on a semiconductor wafer using plasma includes an electrostatic chuck for holding the semiconductor wafer, a slit valve, attached to a sidewall of the process chamber and separated by a first distance from the electrostatic chuck, having a wafer transfer path through which the semiconductor wafer placed above the electrostatic chuck can be loaded or unloaded in the horizontal direction from or to the outside of the process chamber, wherein the temperature of the slit valve is maintained at a higher temperature than the sidewall of the process chamber during an etching process.

In another aspect, a process chamber used in the manufacture of a semiconductor device for depositing a material layer on a semiconductor wafer includes an electrostatic chuck for holding the semiconductor wafer, a heater installed below the wafer chuck, for supplying heat, and a guide ring for guiding the semiconductor wafer, the guide ring installed at the edge of an upper surface of the wafer chuck and separated from the chuck by about 15–25 mm.

BRIEF DESCRIPTION OF THE DRAWINGS

The above object and advantages of the present invention will become more apparent by describing in detail preferred embodiments thereof with reference to the attached drawings in which:

FIGS. 21A and 21B are graphs comparatively showing the amount of particulates generated in a conventional process chamber and the process chamber of FIG. 17.

DETAILED DESCRIPTION OF THE PREFERRED EMBODIMENT

Figure 1:
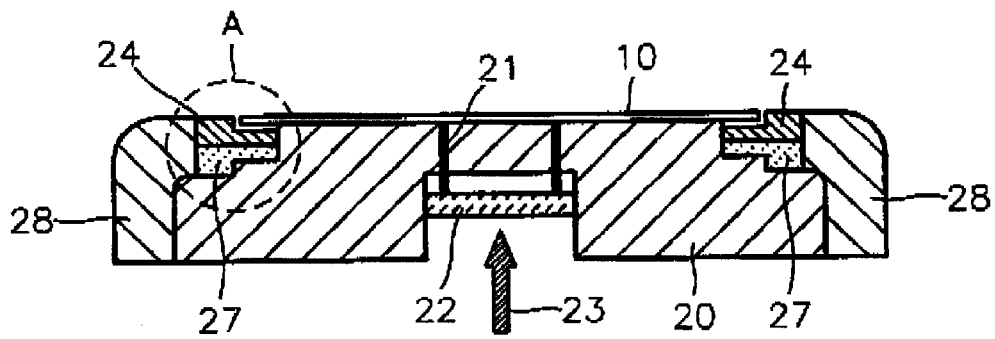
FIG. 1 is a sectional view of a wafer support portion in a conventional process chamber used in the manufacture of a semiconductor device.
Figure 2:
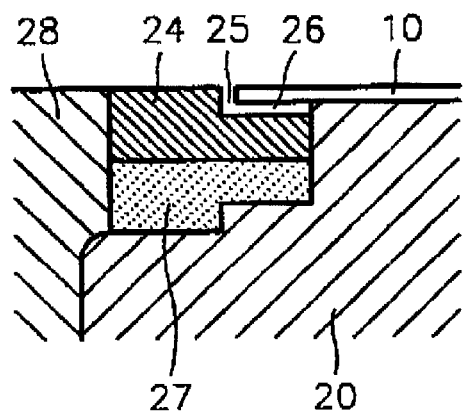
FIG. 2 is an enlarged sectional view of the portion A shown in FIG. 1.
Figure 3:
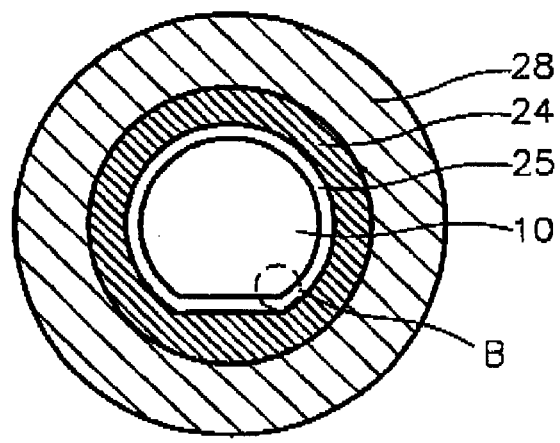
FIG. 3 is a plan view of FIG. 1.
Figure 4:
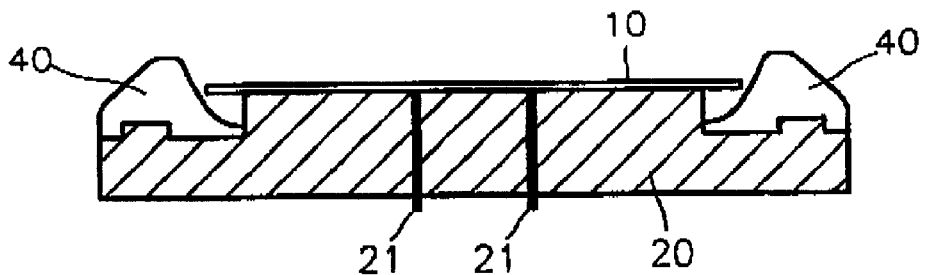
FIG. 4 is a sectional view of another example of a wafer support portion in a conventional process chamber used in the manufacture of a semiconductor device.
Figure 5:
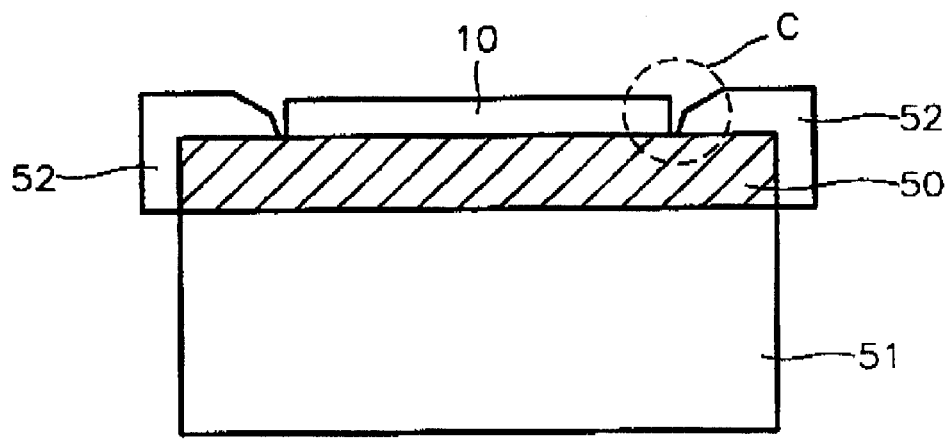
FIG. 5 is a sectional view of yet another example of a wafer support portion in a conventional process chamber used in the manufacture of a semiconductor device.
Figure 6:
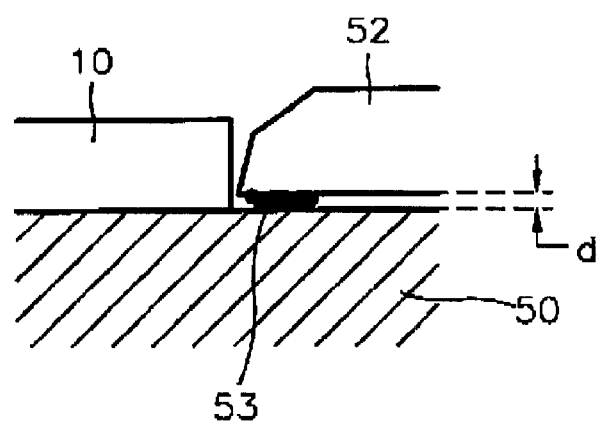
FIG. 6 is an enlarged sectional view of the portion C of FIG. 5.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In addition, Korean application nos. 98-39486 and 99-22541, filed Sep. 23, 1998 and Jun. 16, 1999, respectively, are hereby incorporated by reference as if fully set forth herein.

In accordance with more preferred embodiments of the present invention, the annular edge ring has a first side which faces the side of the semiconductor wafer and contacts the side of the semiconductor wafer. The edge ring preferably has a first upper surface which overlaps the periphery of the bottom surface of the semiconductor wafer and contacts the bottom surface of the semiconductor wafer. Also, the edge ring may have a second side facing the side of the electrostatic chuck, the second side having a shape such that the contact area between the second side and the side of the electrostatic chuck is minimal. To minimize the contact area, the second side of the edge ring may be slanted such that only the edge of the second side contacts the side of the electrostatic chuck. Also, the edge ring may be fixed such that the edge ring cannot rotate. In this case, the edge ring may be fixed by a fixing pin, and may be fixed at two or more points separated from each other by a maximum distance.

The edge ring is preferably made of quartz, silicon or aluminum nitride. Also, the process chamber may further comprise a focus ring formed around the edge ring to make distribution of the plasma uniform.

The focus ring preferably has a first upper surface which overlaps the periphery of the bottom surface of the semiconductor wafer and contacts the bottom surface of the semiconductor wafer. Also, the focus ring may have a second side facing the side of the electrostatic chuck, and the second side preferably has a shape such that the contact area between the second side and the side of the electrostatic chuck is minimal. To minimize the contact area, the second side of the focus ring may be slanted such that only the edge of the second side contacts the side of the electrostatic chuck.

The focus ring is preferably fixed such that the edge ring cannot rotate. Also, the edge ring may be fixed by a fixing pin. In this case, the focus ring may be fixed at two or more points separated from each other by a maximum distance. Preferably, the focus ring is made of quartz, silicon or aluminum nitride.

Preferably, the surface temperature of the focus ring is maintained to be above at least 50° C. across the entire surface of the focus ring during a reaction. To achieve this, the upper surface of the focus ring is preferably flat without protrusions, and the upper surface, which is the farthest away from a heat source, is maintained to be above the surface temperature. In this case, the thickness of the focus ring, from the flat upper surface to the base thereof, may be equal to or less than 20 mm.

The slant angle of the gas supply path in the vertical direction is preferably at least 2 degrees, and the gas supply plate is preferably formed of quartz, silicon or aluminum nitride.

Heat transfer lines are preferably formed to pass near the slit valve, and the number of the heat transfer lines formed near the slit valve is larger than the number of heat transfer lines formed passing through the sidewall. Also, the temperature of the upper part of the sidewall, which is positioned above the wafer transfer path, is the same as or higher than that of the lower part of the sidewall.

Preferably, the inner circumference of the guide ring comprises a first portion protruding toward the semiconductor wafer and separated from the semiconductor wafer by a first interval, and a second portion separated from the semiconductor wafer by a second interval which is longer than the first interval, to guide the semiconductor wafer. In this case, the first interval may be 0.5–1.0 mm, and the second interval may be 2–30 mm.

In a process chamber for etching using plasma in accordance with aspects of the present invention, the edge ring (or focus ring) and a semiconductor wafer preferably contact each other firmly, such that the plasma cannot enter below the bottom surface of the semiconductor wafer, thereby suppressing generation of particulates. Also, because the contact area between the edge ring (or focus ring) and the electrostatic chuck is minimized, the edge ring (or focus ring) can be easily separated from the electrostatic chuck even when particulates are generated. Also, the edge ring (or focus ring) is preferably fixed, so that bumping into the semiconductor wafer due to rotation of the edge ring can be prevented. Also, by changing the temperature distribution in the process chamber or the materials used for the process chamber, the generation of particulates, which depends on the temperature and materials of the process chamber, can be reduced such that the effect of the particulates on the semiconductor wafer can be minimized.

In a process chamber for CVD, the space between the guide ring and the wafer chuck can be maintained at a predetermined level such that reaction gases flow smoothly in the space, thereby suppressing the deposition of a foreign layer by reaction gases in the space between the guide ring and wafer chuck.

Figure 7:
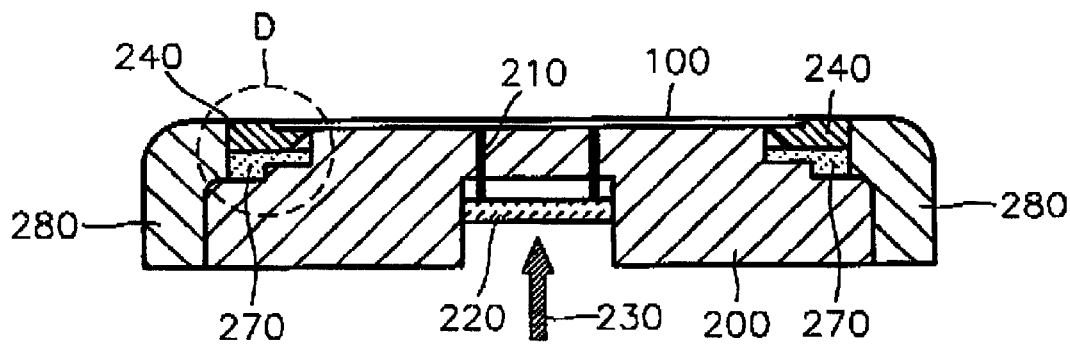
FIG. 7 is a sectional view of a wafer support portion in a process chamber used in the manufacture of a semiconductor device in accordance with an aspect of the present invention.
Figure 8:
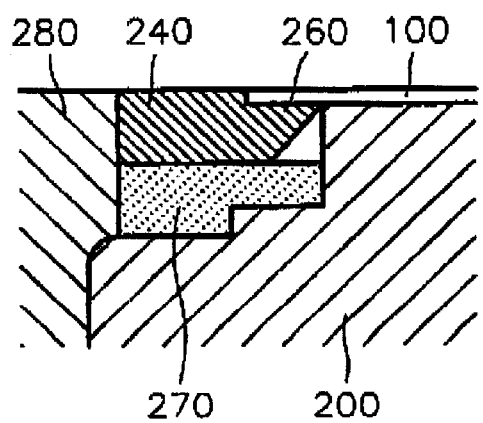
FIG. 8 is an enlarged sectional view of the portion D in FIG. 7.
Figure 9:
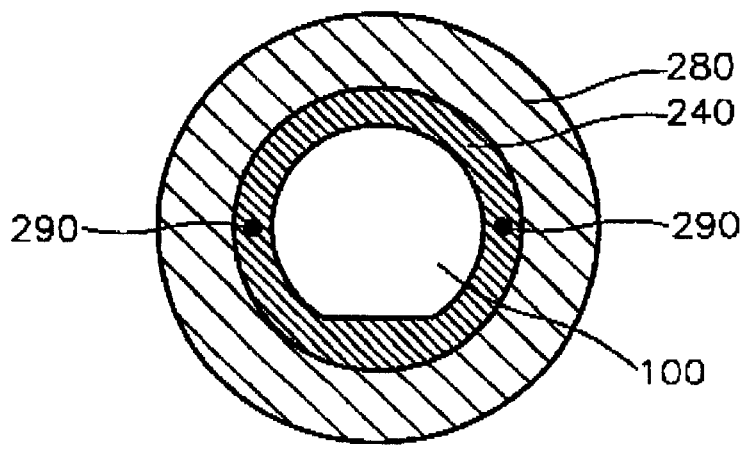
FIG. 9 is a plan view of FIG. 7.

FIG. 7 is a sectional view of an electrostatic chuck for supporting a semiconductor wafer in a process chamber used in the manufacture of a semiconductor device in accordance with an aspect of the present invention. FIG. 8 is an enlarged sectional view of the edge (portion D) of the semiconductor wafer of FIG. 7, and FIG. 9 is a plan view of FIG. 7.

Referring to FIG. 7, an electrostatic chuck 200 holds a semiconductor wafer 100 by electrostatic adsorption. A power supply (not shown) for supplying a high voltage is connected to the electrostatic chuck 200 in order to induce static electricity. Lift pins 210 for moving the semiconductor wafer 100 up and down when loading or unloading the semiconductor wafer 100, pass through the center of the electrostatic chuck 200. The lift pins 210 are in contact with a support plate 220 installed below the electrostatic chuck 200. The support plate 220 can move upwards in response to a force applied by an external lifter (not shown), in a direction indicated by an arrow 230. The lift pins 210 move upwards in response to upward movement of the support plate 220. Then, the lift pins 210 protrude past the surface of the electrostatic chuck 200 and the semiconductor wafer 100 supported by the lift pins 210 is separated from the surface of the electrostatic chuck 200.

Edge rings 240 are installed at the upper edge of the electrostatic chuck 200 to fix the semiconductor wafer 100. Also, a coupling ring 270 made of, for example, aluminum (Al), is interposed between the edge ring 240 and the electrostatic chuck 200. The semiconductor wafer 100 is surrounded by a focus ring 280. The focus ring 280 draws a plasma forming region to the edge of the semiconductor wafer 100 during the etching process, such that the plasma forming region is uniformly formed across the semiconductor wafer 100.

As shown in FIG. 8, there is almost no gap between the edge ring 240 and the semiconductor wafer 100. Such a gap between the edge ring 240 and the semiconductor wafer 100 can be reduced to about 0.1–0.15 mm. However, it is preferable to reduce the gap as much as possible. Also, a space between the edge ring 240 and the periphery of the bottom surface of the semiconductor wafer 100 is reduced to a minimal distance. By minimizing the distance between the edge ring 240 and the semiconductor wafer 100, infiltration of parasitic plasma into the space between the edge ring 240 and the bottom surface of the semiconductor wafer 100 can be suppressed as much as possible. Further, the edge of the edge ring 240, which contacts the electrostatic chuck 200, is preferably slanted, forming a triangular space at the contact region. As a result, only one edge point of the edge ring 240 contacts the electrostatic chuck 200, so that the contact area between the edge ring and the electrostatic chuck 200 is minimized. Alternatively, the edge of the chuck may be slanted to create the triangular space. Thus, even when polymers accumulate at the periphery of the bottom surface of the semiconductor wafer 100, a binding area between the edge ring 240 and the electrostatic chuck 200 by the polymers is minimized, so that the edge ring 240 can be easily separated from the semiconductor wafer 100.

Also, as shown in FIG. 9, the edge ring 240 is preferably fixed to the coupling ring 270 or the electrostatic chuck 200 (see FIGS. 7 and 8) by fixing pins 290. The rotation of the edge ring 240 is prevented by the fixing pin 290, so that damage to the semiconductor wafer, which may occur by the rotation of the edge ring 240, can also be prevented.

Figure 10:
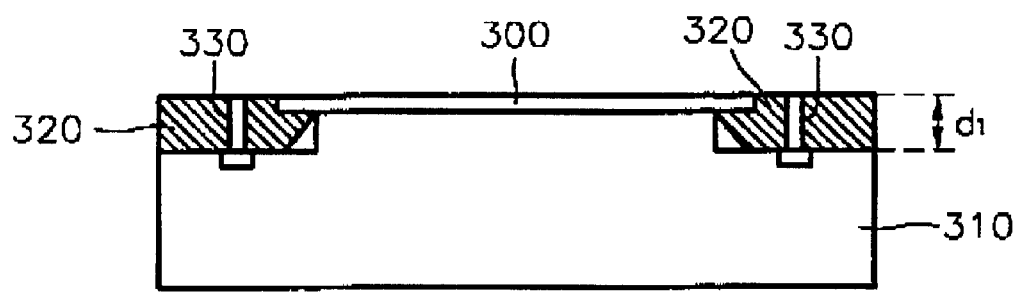
FIG. 10 is a sectional view of a wafer support portion in a process chamber used in the manufacture of a semiconductor device in accordance with an aspect of the present invention.

FIG. 10 is a sectional view of an electrostatic chuck for supporting a semiconductor wafer in a process chamber used in the manufacture of a semiconductor device in accordance with an aspect of the present invention. The process chamber of FIG. 10 is different from that of FIG. 7 in that only a focus ring is used without an edge ring.

Referring to FIG. 10, an electrostatic chuck 310 holds a semiconductor wafer 300 by electrostatic adsorption. A power supply (not shown) for supplying a high voltage is connected to the electrostatic chuck 310 in order to induce static electricity, and lift pins (not shown) which are moved when loading or unloading the semiconductor wafer 100, pass through the electrostatic chuck 310. Also, an annular focus ring 320 is installed around the edge of the electrostatic chuck 310. The focus ring 320 draws a plasma forming region to the edge of the semiconductor wafer 300 during the etching process, such that the plasma forming region is uniformly formed across the semiconductor wafer 300. The focus ring 320 can also fix the semiconductor wafer 300.

In the case of only using the focus ring without the edge ring, as mentioned above, the gap between the focus ring 320 and the semiconductor wafer 300 and the space between the focus ring 320 and the periphery of the bottom surface of the semiconductor wafer 300 are both minimized. Also, the edge of the focus ring 320, facing the upper side of the electrostatic chuck 310, is preferably slanted to reduce the contact area between the focus ring 320 and the electrostatic chuck 310 as much as possible. Alternatively, the edge of the chuck may be slanted to create the triangular space. By doing so, the area between the focus ring 320 and the electrostatic chuck 310, which is bound by polymers can be minimized, so that the focus ring 320 can be easily separated from the electrostatic chuck 310 without damage to the focus ring 320. Also, the focus ring 320 is fixed to the electrostatic chuck 310 by fixing pins 330. Because the focus ring 320 is fixed, the focus ring 320 does not rotate even though the focus ring 320 is spaced further apart from the semiconductor wafer 300. As a result, bumping of the focus ring 320 into the semiconductor wafer can be minimized or prevented.

In general, the upper surface of the focus ring 320 is partially etched during the etching process, so that the lifetime of the focus ring 320 is shortened. In general, because the thickness $d_1$, of the focus ring 320 may affect the processing result, the thickness of the focus ring 320 must be restricted. The thickness $d_1$ of the focus ring 320 which is widely in use, is approximately 3.6 mm. However, in the this embodiment, the thickness $d_1$ of the focus ring was increased to approximately 4.5 mm. As a result, the lifetime of the focus ring 320 was increased by about 2–3 times, without affecting the processing result.

Figure 11:
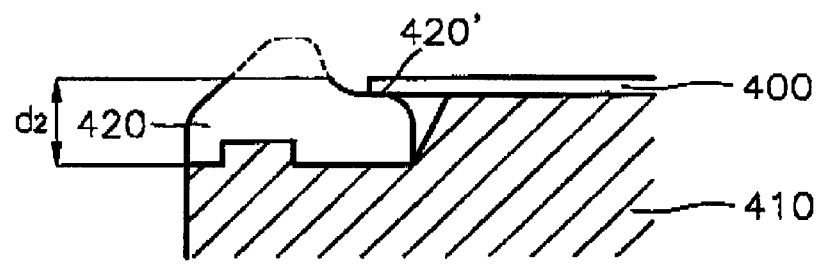
FIG. 11 is a sectional view showing a focus ring used in a process chamber in accordance with an aspect of the present invention.

FIG. 11 shows a focus ring in a process chamber used in the manufacture of a semiconductor device in accordance with an aspect of the present invention. Referring to FIG. 11, a focus ring 420 used in a process chamber used in the manufacture of a semiconductor device is installed around the edge of the electrostatic chuck 410 and has an annular shape, such that the focus ring 420 is separated from the edge of the semiconductor wafer 400 by a predetermined distance. However, a portion 420' of the focus ring 420 contacts firmly with the periphery of the bottom surface of the semiconductor wafer 400 in order to prevent parasitic plasma from infiltrating into the space between the bottom surface of the semiconductor wafer 400 and the focus ring 420. The total height $d_2$ of the focus ring 420 is half that of the conventional focus ring. For example, assuming that the total height of the conventional focus ring from the base to the protruding portion is approximately 30 mm, the total height $d_2$ of the focus ring used in a process chamber for manufacturing a semiconductor device can be less than 20 mm, preferably approximately 15 mm. That is, as shown in FIG. 11, the upper surface of the focus ring can be flattened by removing the protruding portion from a conventional focus ring (drawn with dashed lines), such that the temperature distribution across the surface of the focus ring 420 becomes uniform. In the case of adopting such a focus ring, the amount of polymer accumulated on the focus ring varies according to the difference in temperature of the focus ring.

Figure 12:
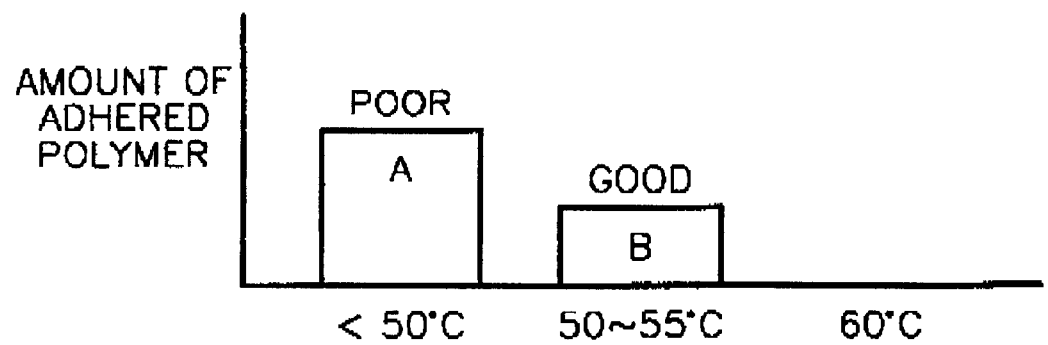
FIG. 12 is a graph showing the adhering condition of polymer and the amount of adhering polymer with respect to the temperature across the surface of the focus ring shown in FIG. 11.

FIG. 12 is a graph showing the amount of adhered polymer with respect to the temperature at the surface of the focus ring. Referring to FIG. 12, at a portion of the focus ring at below 50° C. (hereinafter, referred to as portion A), the amount of adhered polymer is the largest and the adhering status is also very poor. Polymer also adheres to a portion of the focus ring at 50–55° C. (hereinafter, referred to as portion B). However, the amount of polymer adhering to the portion B is less than that adhering to the portion A, and the adhesion status is better than in the portion A.

However, polymers do not adhere to a portion of the focus ring, at a temperature higher than 60° C.

The amount of polymers adhering to the focus ring and the adhesion status of the polymers vary according to the difference in temperature at the surface of the focus ring. The reason for the occurrence of a temperature difference in the focus ring is that the distance from a heat source to each portion of the focus ring is different. In general, a heater is installed below an electrostatic chuck as a heat source. Thus, the temperature of the focus ring is the highest at the base, and the temperature of the focus ring decreases toward the upper portion of the focus ring. Thus, the largest amount of polymers adheres to the upper protruding portion of the focus ring having the lowest temperature, and the adhesion status of the polymers at the upper portion is worst. In addition, a semiconductor wafer is placed adjacent to the protruding portion of the focus ring, and the semiconductor wafer can be deteriorated by the large amount of polymers which are poorly adhered to the focus ring. However, in the focus ring which is flattened by removing the upper protruding portion having the lowest temperature, the temperature can be evenly distributed over the focus ring. Here, the thickness of the focus ring is controlled such that the temperature of the focus ring is maintained at above 60° C., thereby reducing the amount of loosely adhered polymers.

Such a change in the adhesion status of polymers due to the difference in temperature of each portion of the focus ring can be applied to other parts. The change in adhesion status of the polymer in other parts of the process chamber will be described with reference to FIG. 13.

Figure 13:
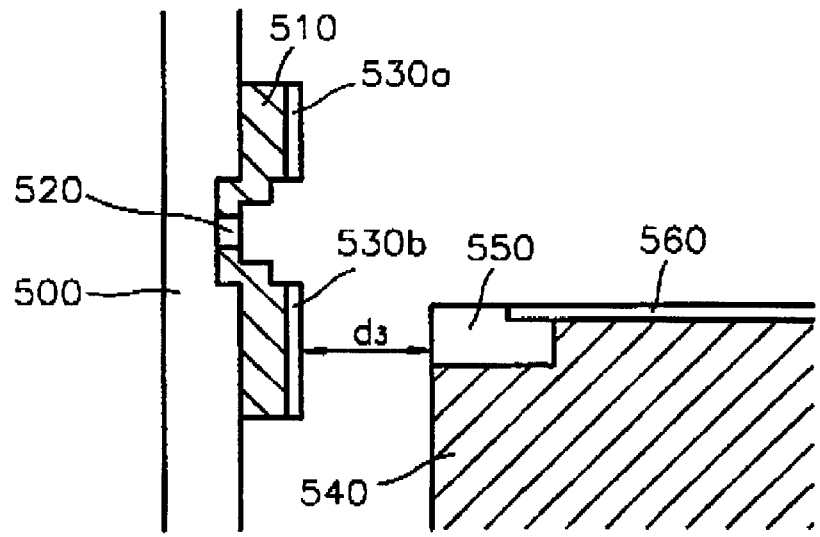
FIG. 13 is a sectional view showing a sidewall of a process chamber in accordance with an aspect of the present invention.

FIG. 13 is a sectional view showing a sidewall of a process chamber used for manufacturing a semiconductor device in accordance with an aspect of the present invention. Referring to FIG. 13, a slit valve 520 for transferring a semiconductor wafer 560 is installed in a sidewall 510 attached to an external wall 500 of the process chamber. The sidewall 510 is formed of anodized aluminum (Al) and liners 530a and 530b are attached to the sidewall 510, facing the inner space of the process chamber. The liners 530a and 530b are for preventing polymers from adhering to the sidewall 510 of the process chamber. The semiconductor wafer 560 is guided by a focus ring 550 placed on the wafer chuck 540, and the liners 530a and 530b are separated from the semiconductor wafer 560 by a predetermined distance $d_3$. In such a process chamber, a heater is placed below the wafer chuck 540 as a heat source. Thus, the temperatures of the liners 530a and 530b vary according to their height. For example, temperature of the lower liner 530b, which is closer to the heater, is higher than that of the upper liner 530b, which is farther from the heater. Thus, as described above, a larger amount of polymers accumulate on the upper liner 530a than on the lower liner 530b, and the adhesion status of polymers is poorer in the upper liner 530a. If the upper liner 530a is placed above a wafer transfer path, the polymer adhering to the upper liner 530a may fall onto the semiconductor wafer 560. Thus, by controlling the temperature of the upper liner 530a so that is not lower than the temperature of the lower liner 530b, the possibility of failure in the process can be lowered. In the same manner, the temperature of the slit valve 520, which forms the wafer transfer path, can be increased as much as possible, thereby preventing the slit valve 520 from being contaminated by the polymers. To accomplish this increase in temperature, more heat transfer lines passing near the slit valve 520 are installed than those passing through the sidewall 510 of the process chamber.

Figure 14:
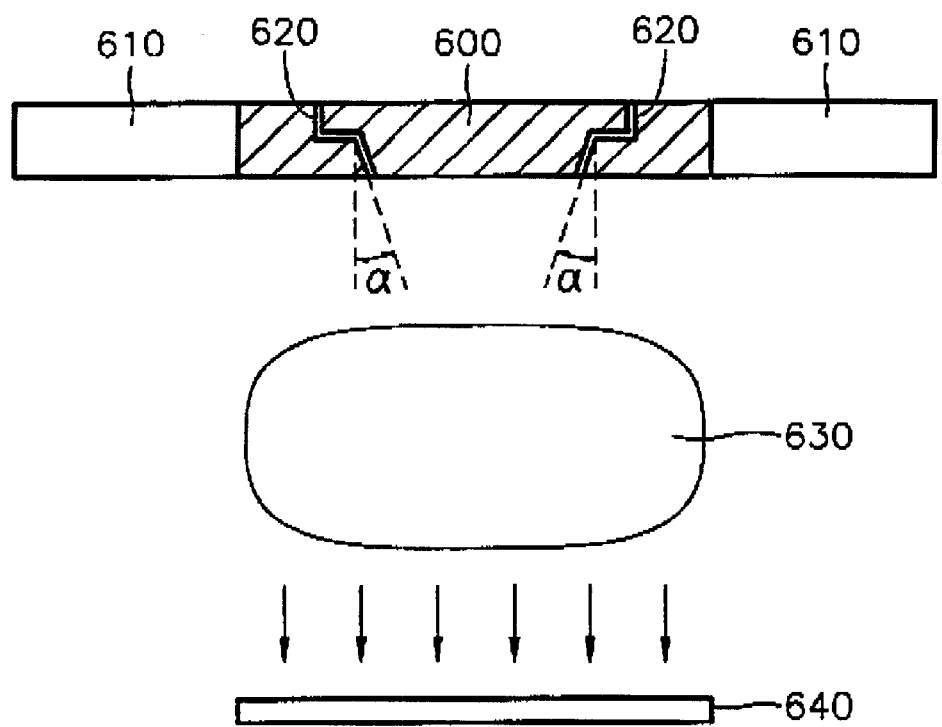
FIG. 14 is a sectional view showing a gas supply portion in a process chamber used in the manufacture of a semiconductor device in accordance with an aspect of the present invention.

FIG. 14 is a sectional view showing a gas supply portion used in a process chamber for manufacturing a semiconductor device in accordance with an aspect of the present invention. Referring to FIG. 14, a gas supply plate 600 is located in a cover 610 of the process chamber. A gas supply line (not shown) for supplying gas is connected to the upper portion of the gas supply plate 600. A reaction gas, such as an etching gas, is supplied into the process chamber through holes 620 formed in the gas supply plate 600. The energy of the etching gas supplied into the process chamber is increased by a high radio frequency (RF) power. High energy gas molecules collide with neighboring neutral molecules, generating electrons and ions. Due to repeated collisions, a plasma 630 is formed in the reaction chamber, and in particular, above the semiconductor wafer 640.

In the etching process, the level of uniformity with which the plasma 630 is distributed greatly affects the result of the process. That is, the distribution of the plasma 630 must be uniform in the space on the semiconductor wafer 640. However, the plasma 630 can be drawn to the edge of the semiconductor wafer 640 due to the focus ring formed around the semiconductor wafer 640, so that the plasma 630 may be concentrated near the edge of the semiconductor wafer 640. Thus, the structure of the holes 620 of the gas supply plate 600, which directly affects the distribution of plasma 630, is changed such that the density of the plasma 630 is higher at the center than near the edge of the semiconductor wafer 640. In particular, the gas supply lines 620 which pass through the gas supply plate 600 are slanted such that gas discharge portions thereof point toward the center of the semiconductor wafer. Preferably, the slant angle α of the gas discharge portion with respect to the vertical direction of the gas supply line 632 can be about 2–5°. If the angle a of the gas supply line 620 is too large, the plasma 630 is so dense at the center of the semiconductor substrate that the plasma 630 cannot distribute uniformly. Because the reaction gas is supplied toward the center of the semiconductor wafer 640, the plasma density is locally increased at the center. However, since the focus ring draws the plasma, the distribution of plasma becomes uniform.

The sidewall, gas supply plate, focus ring or edge ring of FIGS. 7–14 can be made of, for example, quartz, silicon or aluminum nitride. That is, when a metal layer to be etched is formed of tungsten (W), $SF_3$ is used as an etching gas for removing the tungsten layer, and $Cl_2$ and $BCl_3$ are used as etching gases for removing a barrier metal layer. In particular, $SF_6$ gas leads to isotropic etching by a reaction with $Al_2O_3$ which is used to form a conventional focus ring, and increases etching damage by F ions, resulting in Al, F and O byproducts. However, the generation of byproducts can be suppressed by using quartz, silicon or aluminum nitride.

Figure 15:
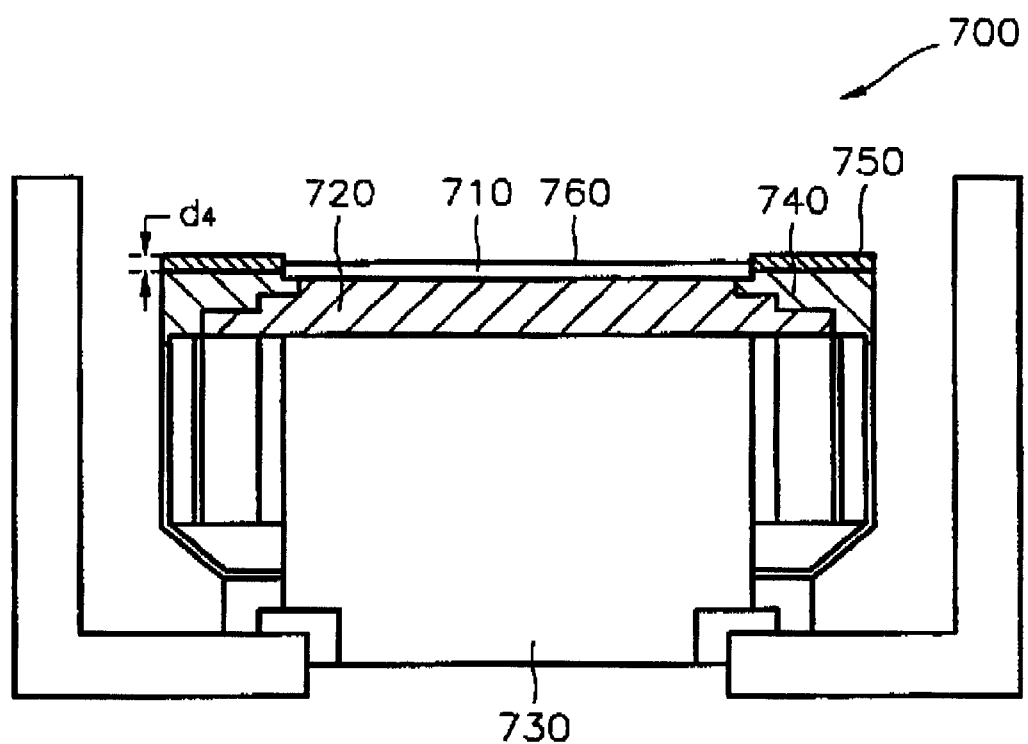
FIG. 15 is a sectional view showing a part of a process chamber used in the manufacture of a semiconductor device in accordance with an aspect of the present invention.

FIG. 15 is a sectional view showing a part of a process chamber used in the manufacture of a semiconductor device in accordance with an aspect of the present invention. Referring to FIG. 15, a semiconductor wafer 710 is seated on an electrostatic chuck 720 in a process chamber 700. The electrostatic chuck 720 is placed on a support stand 730. A semiconductor wafer 710 is guided by an annular focus ring 740 formed around the edge of the electrostatic chuck 720. The focus ring 740 also makes the density of plasma uniform across the semiconductor wafer 710. The focus ring 740 for these functions has an upper portion 750.

The thickness $d_4$ of the upper portion 750 of the focus ring 740 is controlled to be higher than the upper surface of the semiconductor wafer 710. Preferably, the thickness $d_4$ of the upper portion 750 is approximately 2.4–3.0 mm. If the thickness $d_4$ of the upper portion 750 is more than 3 mm, a wafer transfer means, for example, a robotic arm (not shown), used to transfer the semiconductor wafer 710, may contact the upper portion 750. If the thickness $d_4$ of the upper portion 750 is less than 2.4 mm, the original function of the upper portion 750 is deteriorated, thereby shortening the lifetime of the upper portion 750.

Figure 16:
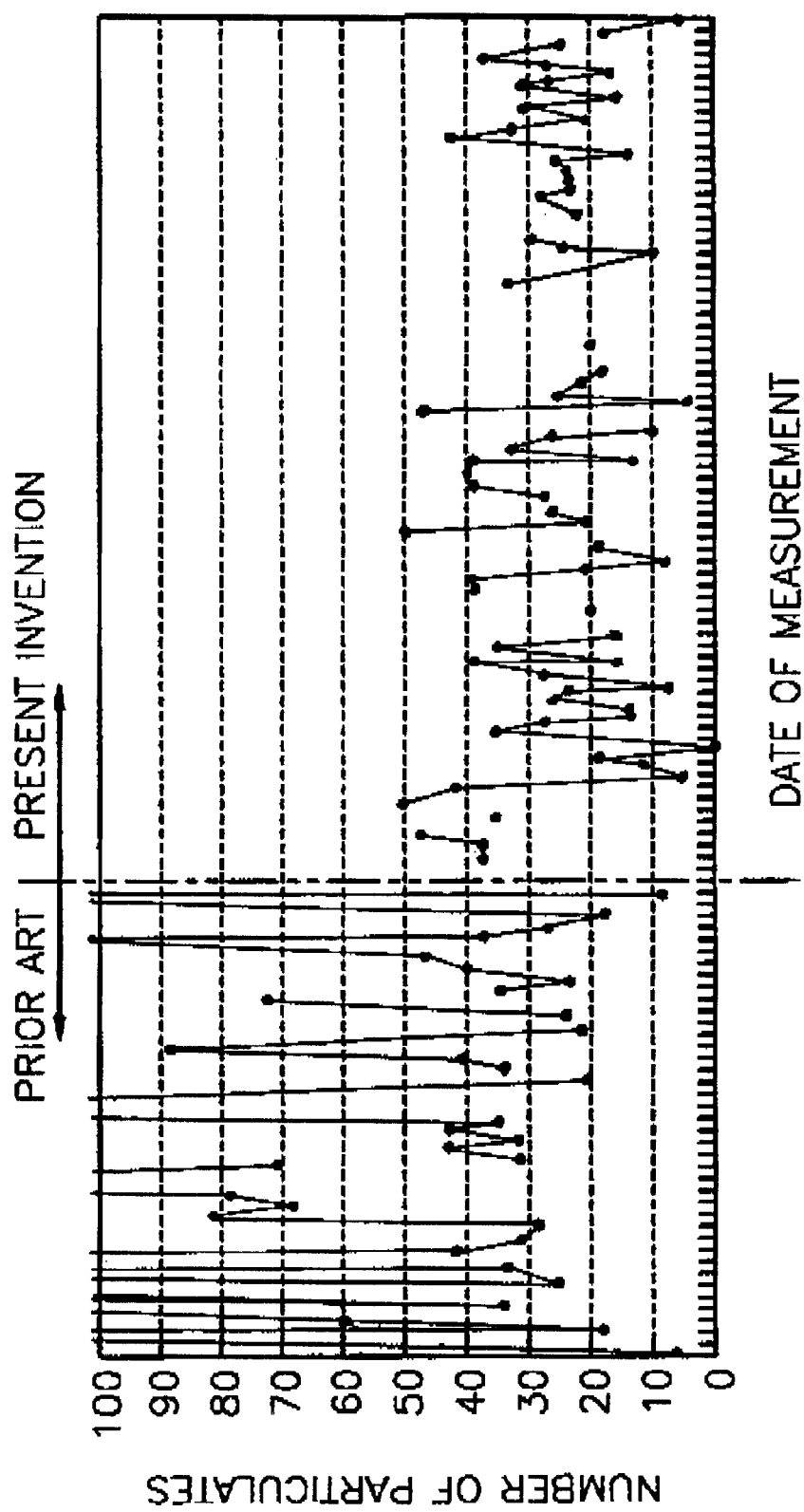
FIG. 16 is a graph comparatively showing the amount of particulates generated in the processor chamber of FIG. 15 and in a conventional processor chamber.

FIG. 16 is a graph comparatively showing the amount of particulates generated in a conventional process chamber and in a process chamber as shown in FIG. 15. The conventional process chamber used for this comparison was a process chamber having a focus ring which has a wing extended in the vertical direction.

Figure 17:
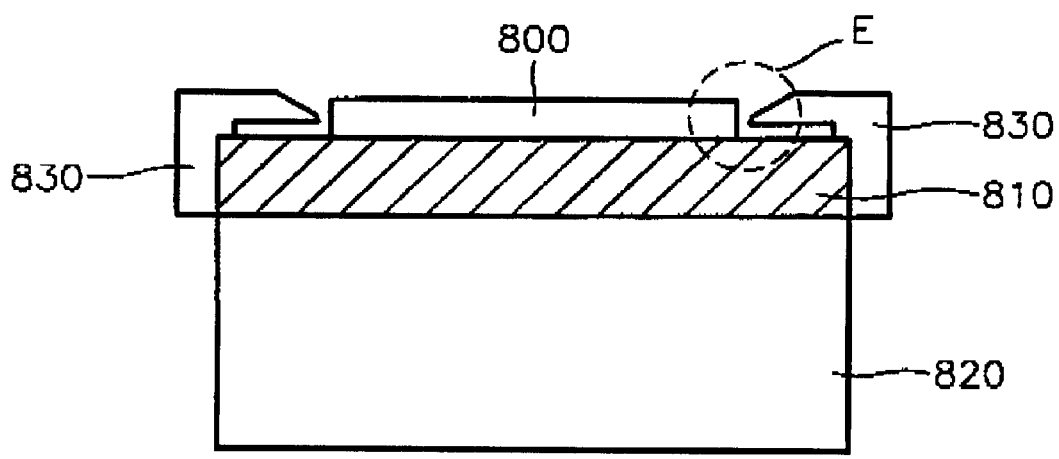
FIG. 17 is a sectional view of a wafer support portion in a process chamber used in the manufacture of a semiconductor device in accordance with an aspect of the present invention.
Figure 18:
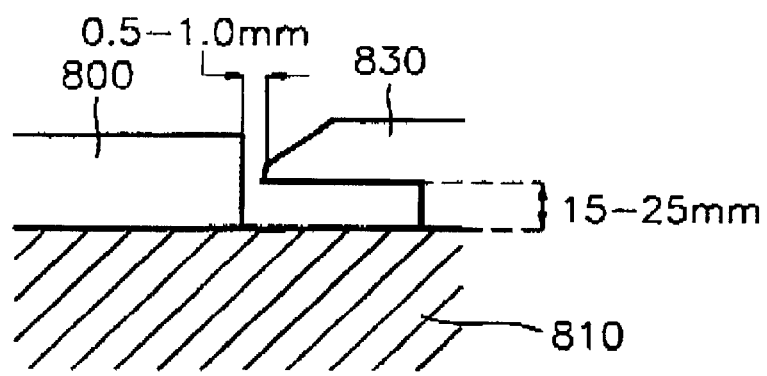
FIG. 18 is an enlarged view of the portion E of FIG. 17.

As shown in FIG. 16, the number of particulates generated in the process chamber according to the present invention is markedly reduced compared to the number of particulates generated in the conventional process. FIG. 17 is a sectional view of another process chamber used in manufacturing a semiconductor device in accordance with an aspect of the present invention, and in particular, showing a wafer support portion in a process chamber for chemical vapor deposition (CVD). FIG. 18 is an enlarged view of the portion E of FIG. 17, and FIG. 19 is a plan view of FIG. 17.

Figure 19:
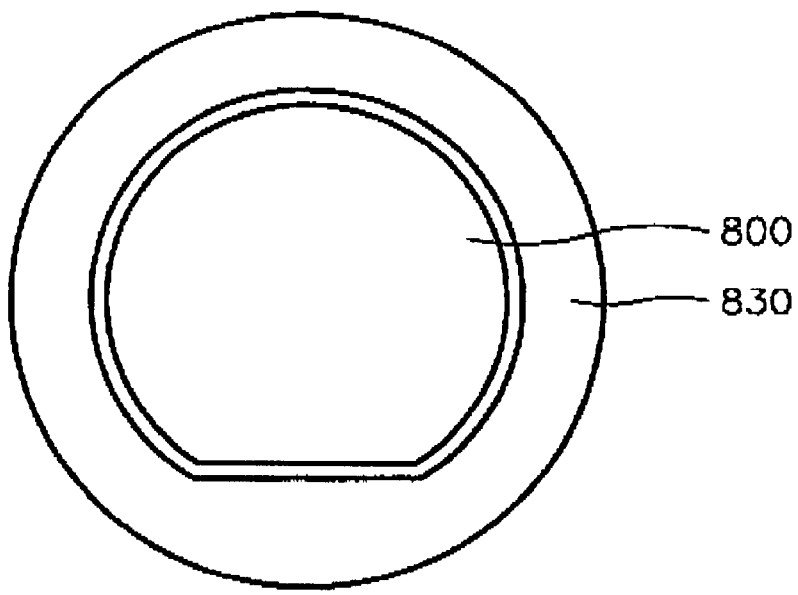
FIG. 19 is a plan view of FIG. 17.

Referring to FIGS. 17 through 19, a semiconductor wafer 800 is seated on a wafer chuck 810, and a heater 820 is installed below the wafer chuck 810. Also, an annular guide ring 830 is arranged around the edge of the upper surface of the wafer chuck 810. The guide ring 830 is for preventing the semiconductor wafer 800 from departing from its original position during the CVD process. For this, the guide ring 830 is separated by a predetermined distance, for example, about 0.1–1.0 mm, from the semiconductor wafer 800. The guide ring 830 is separated by a distance of approximately 15–25 mm from the upper surface of the wafer chuck 810, which allows reaction gases to flow smoothly in the space. As a result, the formation of an undesirable layer can be suppressed.

Figure 20:
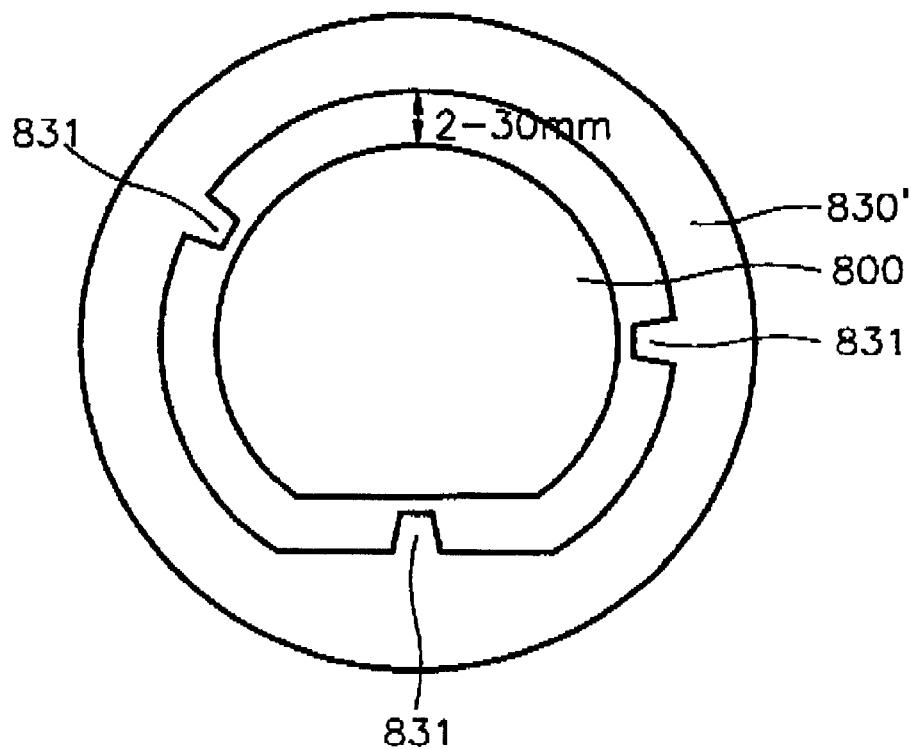
FIG. 20 is a plan view showing another example of the guide ring of FIG. 17.

FIG. 20 is a plan view showing another example of the guide ring shown in FIG. 17. Referring to FIG. 20, a guide ring 830' is separated by a first interval, for example, about 2–30 mm, from a semiconductor wafer 800 around its inner circumference, which permits the reaction gas to flow smoothly in the space between the semiconductor wafer 800 and the guide ring 830'. Also, to guide the semiconductor wafer 800, a plurality of protrusions 831 are spaced around the inner circumstance of the guide ring 830', and the plurality of protrusions 831 are separated by a second interval which is smaller than the first interval, for example, about 0.5–1.0 mm, from the semiconductor wafer 800.

FIG. 21A is a graph showing the number of particulates generated in a conventional process chamber with respect to the number of processed wafers, and FIG. 21B is a graph showing the number of particulates in a process chamber as shown in FIG. 17 with respect to the number of processed wafers. In FIGS. 21A and 21B, ♦ indicates the number of particulates having a diameter larger than 0.2 μm which are generated on the semiconductor wafer, and ● indicates the number of particulates having a diameter larger than 0.2 μm which are generated in the process chamber.

Referring to FIG. 21A, because the reaction gas cannot flow smoothly between a semiconductor wafer and a wafer chuck in the conventional process chamber, a cleaning process has to be performed using a predetermined cleaning gas, such as $ClF_3$, after processing 500 sheets of semiconductor wafers. Nevertheless, when the number of processed semiconductor wafers reaches about 1000 sheets, a large amount of particulates are generated as shown in FIG. 21A.

However, referring to FIG. 21B, in the process chamber according to the present invention, a small number of particulates are generated after 1000 or more sheets of semiconductor wafers are processed. Thus, an intermediate cleaning process is not required, thereby reducing the number of steps in processing.

We claim:

1. A process chamber used in the manufacture of a semiconductor device for etching a material on a semiconductor wafer using plasma, the process chamber comprising:
   an electrostatic chuck for holding the semiconductor wafer, wherein the semiconductor wafer has a top surface, a bottom surface and a peripheral side; and
   an annular edge ring, which surrounds the peripheral side and the periphery of the bottom surface of the semiconductor wafer on the electrostatic chuck to prevent the semiconductor wafer from separating from its original position, having a first side which faces and surrounds the peripheral side of the semiconductor wafer such that a top surface of the annular edge ring is at a same height as the top surface of the semiconductor wafer,
   wherein a distance between the peripheral side of the semiconductor wafer and the first side is less than 0.15 mm,
   and wherein the annular edge ring is fixed such that the annular edge ring cannot rotate.

2. The process chamber of claim 1, wherein the first side contacts the peripheral side of the semiconductor wafer.

3. The process chamber of claim 1, wherein the edge ring has a first upper surface which overlaps the periphery of a bottom surface of the semiconductor wafer and contacts the bottom surface of the semiconductor wafer.

4. The process chamber of claim 1, wherein the edge ring has a second side facing a side of the electrostatic chuck, the second side of the edge ring having a shape such that the second side of the edge ring contacts the side of the electrostatic chuck such that the area of contact between the second side and a side of the electrostatic chuck is minimal.

5. The process chamber of claim 4, wherein the second side of the edge ring is slanted such that only the edge of the second side contacts the side of the electrostatic chuck.

6. The process chamber of claim 1, wherein the edge ring is fixed by a fixing pin.

7. The process chamber of claim 1, wherein the edge ring is fixed at two or more points separated from each other by a maximum distance.

8. The process chamber of claim 1, wherein the edge ring comprises quartz, silicon or aluminum nitride.

9. The process chamber of claim 1, further comprising a focus ring formed around the edge ring to make distribution of the plasma uniform.

* * * * *